United States Patent
Kajiwara et al.

(10) Patent No.: US 10,461,232 B2
(45) Date of Patent: Oct. 29, 2019

(54) CONDENSATION REACTION-TYPE DIE BONDING AGENT, LED LIGHT EMITTING DEVICE AND METHOD FOR MANUFACTURING SAME

(71) Applicants: Citizen Watch Co., Ltd., Nishitokyo-shi, Tokyo (JP); Citizen Electronics Co., Ltd., Fujiyoshida-shi, Yamanashi (JP)

(72) Inventors: Hiroo Kajiwara, Yamanashi (JP); Yuji Ogawa, Osaka (JP); Kenichiro Sato, Hadano (JP); Yuta Yaguchi, Hadano (JP)

(73) Assignees: CITIZEN WATCH CO., LTD., Tokyo (JP); CITIZEN ELECTRONICS CO., LTD., Yamanashi (JP)

( * ) Notice: Subject to any disclaimer, the term of this patent is extended or adjusted under 35 U.S.C. 154(b) by 0 days.

(21) Appl. No.: 16/069,556

(22) PCT Filed: Jan. 13, 2017

(86) PCT No.: PCT/JP2017/001064
§ 371 (c)(1),
(2) Date: Jul. 12, 2018

(87) PCT Pub. No.: WO2017/122796
PCT Pub. Date: Jul. 20, 2017

(65) Prior Publication Data
US 2018/0323355 A1 Nov. 8, 2018

(30) Foreign Application Priority Data
Jan. 15, 2016 (JP) .................................. 2016-006320

(51) Int. Cl.
*H01L 33/60* (2010.01)
*C08L 83/04* (2006.01)
(Continued)

(52) U.S. Cl.
CPC .............. *H01L 33/60* (2013.01); *C08L 83/04* (2013.01); *H01L 33/56* (2013.01); *C08G 77/16* (2013.01);
(Continued)

(58) Field of Classification Search
CPC ......... H01L 21/52; H01L 33/56; H01L 33/60; H01L 33/62
See application file for complete search history.

(56) References Cited

U.S. PATENT DOCUMENTS

2010/0273927 A1* 10/2010 Taguchi .................. C08L 83/04
524/433
2013/0134609 A1 5/2013 Yoshitake et al.
(Continued)

FOREIGN PATENT DOCUMENTS

JP 2010254825 A 11/2010
JP 2011086844 A 4/2011
(Continued)

OTHER PUBLICATIONS

English translation of the International Preliminary Report on Patentability for International Application No. PCT/JP2017/001064, dated Feb. 28, 2017, 5 pages.
(Continued)

Primary Examiner — Joseph M Galvin, III
(74) Attorney, Agent, or Firm — Ratnerprestia

(57) ABSTRACT

A condensation reaction-type die bonding agent has little liability of poor electrical connection at the electrodes. A condensation reaction-type die bonding agent for bonding an LED device provided on its surface with device electrodes having connection surfaces covered by gold, where the die bonding agent includes (A) a polysilsesquioxane solid in state at room temperature having trisiloxy units ($T_A$) expressed by $R^1SiO_{3/2}$ where, $R^1$ indicates one group
(Continued)

selected from the group comprised of C1 to C15 alkyl groups, a phenyl group, and a benzyl group, and having hydroxyl groups, (B) a polysilsesquioxane liquid in state at room temperature having trisiloxy units ($T_B$) expressed by $R^2SiO_{3/2}$ where, $R^2$ indicates one group selected from the group comprised of C1 to C15 alkyl groups, a phenyl group, and a benzyl group, and having —$OR^2$ where, $R^2$ indicates one group selected from the group comprised of C1 to C15 alkyl groups, a phenyl group, and a benzyl group, and (C) a condensation reaction catalyst.

10 Claims, 7 Drawing Sheets

(51) Int. Cl.
*H01L 33/56* (2010.01)
*H01L 21/52* (2006.01)
*C08G 77/16* (2006.01)
*C08G 77/18* (2006.01)
*H01L 33/62* (2010.01)

(52) U.S. Cl.
CPC .............. *C08G 77/18* (2013.01); *H01L 21/52* (2013.01); *H01L 33/62* (2013.01); *H01L 2224/48091* (2013.01); *H01L 2224/73265* (2013.01); *H01L 2224/92247* (2013.01); *H01L 2924/181* (2013.01); *H01L 2933/0033* (2013.01)

(56) References Cited

U.S. PATENT DOCUMENTS

2013/0161686 A1* 6/2013 Yoshitake ............... C08L 83/00
257/100
2016/0326340 A1 11/2016 Tabei et al.

FOREIGN PATENT DOCUMENTS

| JP | 2012012433 A | 1/2012 |
| JP | 2012012434 A | 1/2012 |
| JP | 2012072207 A | 4/2012 |
| JP | 2013057000 A | 3/2013 |
| JP | 2013159776 A | 8/2013 |
| JP | 2015140372 A | 8/2015 |
| WO | 2015053412 A1 | 4/2015 |

OTHER PUBLICATIONS

International Search Report and Written Opinion for International Application No. PCT/JP2017/001064, dated Feb. 28, 2017—7 pages.

* cited by examiner

CONDENSATION REACTION-TYPE DIE BONDING AGENT, LED LIGHT EMITTING DEVICE AND METHOD FOR MANUFACTURING SAME

CROSS REFERENCE TO RELATED APPLICATIONS

This is the U.S. National Phase application of PCT/JP2017/001064, filed Jan. 13, 2017, which claims priority to Japanese Patent Application 2016-006320, filed Jan. 15, 2016, the disclosures of these applications being incorporated herein by reference in their entireties for all purposes.

TECHNICAL FIELD OF THE INVENTION

The present invention relates to a condensation reaction-type die bonding agent and to an LED light emitting device and a method for manufacturing the same.

BACKGROUND OF THE INVENTION

It is known that an LED light emitting device obtained by bonding an LED device and a mounting substrate by a bonding agent, then connecting electrodes of the LED device and electrodes of the mounting substrate by interconnect members and sealing the LED device and interconnect members by a sealing member. Further, in the LED light emitting device, it is known to use a silicone resin composition as the die bonding agent for bonding the mounting substrate and LED device.

For example, the silicone resin composition described in Patent Document 1 is excellent in transferability and work efficiency and can form a cured product excellent in hardness, heat discoloration resistance, bondability, and crack resistance by an addition reaction, so can be used as a die bonding agent.

Patent Documents

[Patent Document 1] Japanese Laid Open Patent Document No. 2015-140372

SUMMARY OF THE INVENTION

An addition reaction-type die bonding agent is used to bond a mounting substrate and LED device, connecting the device electrodes of the LED device and the substrate electrodes of the mounting substrate by wire bonding, in some cases the electrical connection between the connected device electrodes and substrate electrodes will be poor.

Heat treatment and/or a predetermined time period of standing is usually performed to cure an addition reaction-type die bonding agent after using the die bonding agent to bond the mounting substrate and LED device. During the heat treatment or standing, the siloxane contained in the addition reaction-type die bonding agent vaporizes and engages in an addition reaction catalyzed by the gold covering the connection surfaces of the device electrodes resulting in insulation layers being formed on the connection surfaces of the LED device. More specifically, the siloxane having SiH groups and the low molecular weight siloxane having vinyl groups contained in the addition reaction-type die bonding agent vaporize and engage in an addition reaction catalyzed by the gold, so insulation layers are formed on the gold covered connection surfaces of the device electrodes of the LED device. These insulation layers are one cause of poor electrical connection.

In one aspect, the object is to provide a condensation reaction-type die bonding agent with little liability of poor electrical connection at the electrodes, a method for manufacturing an LED light emitting device using that die bonding agent, and an LED light emitting device using that die bonding agent.

To achieve the above object, the die bonding agent according to an embodiment is a condensation reaction-type die bonding agent for bonding an LED device provided on its surface with device electrodes having connection surfaces covered by gold, containing: (A) a polysilsesquioxane solid in state at room temperature having trisiloxy units ($T_A$) expressed by $R^1SiO_{3/2}$ (where, $R^1$ indicates one group selected from the group comprised of C1 to C15 alkyl groups, a phenyl group, and a benzyl group) and having hydroxyl groups, (B) a polysilsesquioxane liquid in state at room temperature having trisiloxy units ($T_B$) expressed by $R^2SiO_{3/2}$ (where, $R^2$ indicates one group selected from the group comprised of C1 to C15 alkyl groups, a phenyl group, and a benzyl group) and having $-OR^2$ (where, $R^2$ indicates one group selected from the group comprised of C1 to C15 alkyl groups, a phenyl group, and a benzyl group), and (C) a condensation reaction catalyst.

Further, the method for manufacturing a light emitting device according to an embodiment comprises using a die bonding agent to bond an LED device provided on its surface with device electrodes having connection surfaces covered by gold to a surface of a mounting substrate having substrate electrodes, connecting the substrate electrodes and the connection surfaces of the device electrodes by conductive interconnect members, and sealing the LED device by a sealing member, wherein the die bonding agent is a condensation reaction type bonding agent containing (A) a polysilsesquioxane solid in state at room temperature having trisiloxy units ($T_A$) expressed by $R^1SiO_{3/2}$ (where, $R^1$ indicates one group selected from the group comprised of C1 to C15 alkyl groups, a phenyl group, and a benzyl group) and having hydroxyl groups, (B) a polysilsesquioxane liquid in state at room temperature having trisiloxy units ($T_B$) expressed by $R^2SiO_{3/2}$ (where, $R^2$ indicates one group selected from the group comprised of C1 to C15 alkyl groups, a phenyl group, and a benzyl group) and having $-OR^2$ (where, $R^2$ indicates one group selected from the group comprised of C1 to C15 alkyl groups, a phenyl group, and a benzyl group), and (C) a condensation reaction catalyst.

Further, an LED light emitting device according to an embodiment comprises a mounting substrate having substrate electrodes, an LED device provided on its surface with device electrodes having connection surfaces covered with gold, a bonding member for bonding a front surface of the mounting substrate and a back surface of the LED device, conductive interconnect members with one ends connected to the substrate electrodes and with other ends connected to the connection surfaces of the device electrodes, and a sealing member for sealing the LED device, wherein the bonding member is a cured product obtained by a condensation reaction of the composition containing (A) a polysilsesquioxane solid in state at room temperature having trisiloxy units ($T_A$) expressed by $R^1SiO_{3/2}$ (where, $R^1$ indicates one group selected from the group comprised of C1 to C15 alkyl groups, a phenyl group, and a benzyl group) and having hydroxyl groups, (B) a polysilsesquioxane liquid in state at room temperature having trisiloxy units ($T_B$) expressed by $R^2SiO_{3/2}$ (where, $R^2$ indicates one group selected from the group comprised of C1 to C15 alkyl groups, a phenyl group, and a benzyl group) and having —OR² (where, R² indicates one group selected from the group comprised of C1 to C15 alkyl groups, a phenyl group, and a benzyl group), and (C) a condensation reaction catalyst.

In this Description, the composition containing the (A) component, (B) component, and (C) component before being reacted to cure it will sometimes be called a "die bonding agent". Further, the composition containing the (A) component, (B) component, and (C) component which is made to react to cure it will sometimes be called a "bonding member". The above "room temperature" means 20±15° C., the "solid state" means a usual solid state not having any fluidity at all, while "liquid" designates a state having fluidity and means the state where, for example, the viscosity measured using an E type viscometer is 1,000,000 mPa·s/25° C. or less.

In one aspect, a condensation reaction-type die bonding agent with no liability of vaporization of siloxane having SiH groups is used, so it becomes possible to provide an LED light emitting device with little liability of poor electrical connection of the electrodes.

DETAILED DESCRIPTION OF EMBODIMENTS OF THE INVENTION

Figure 1A:
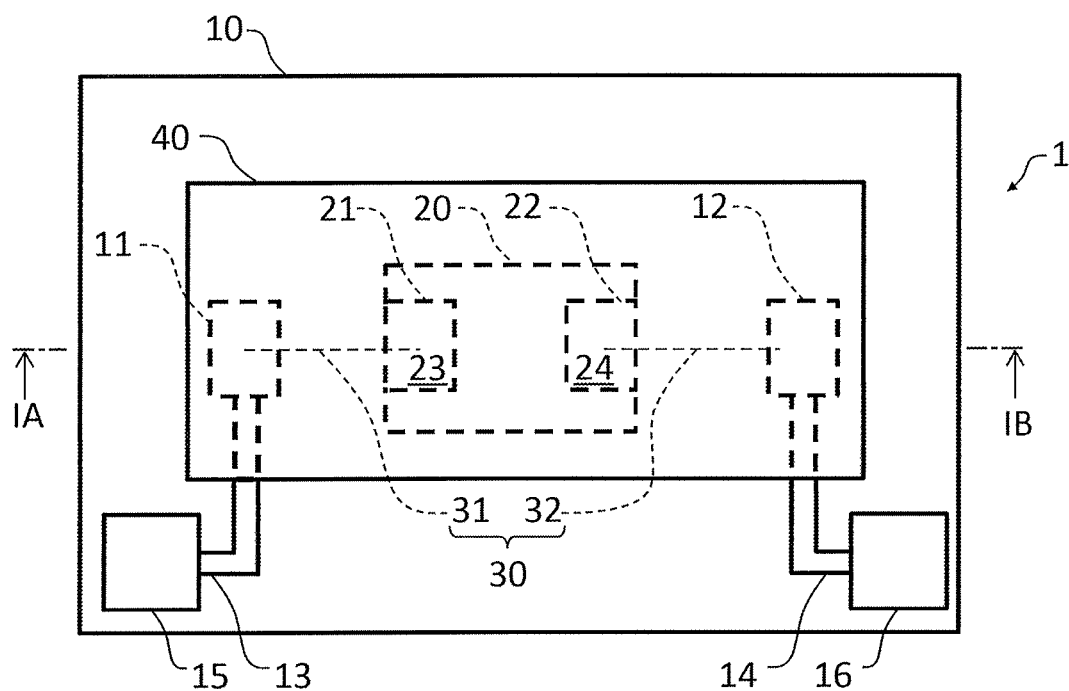
FIG. 1A is a plan view of an LED light emitting device according to an embodiment.

Below, while referring to the drawings, a condensation reaction-type die bonding agent, LED light emitting device, and a method for manufacturing the same will be explained. However, it will be understood that the present invention is not limited to the embodiments described in the drawings or below.

Figure 1B:
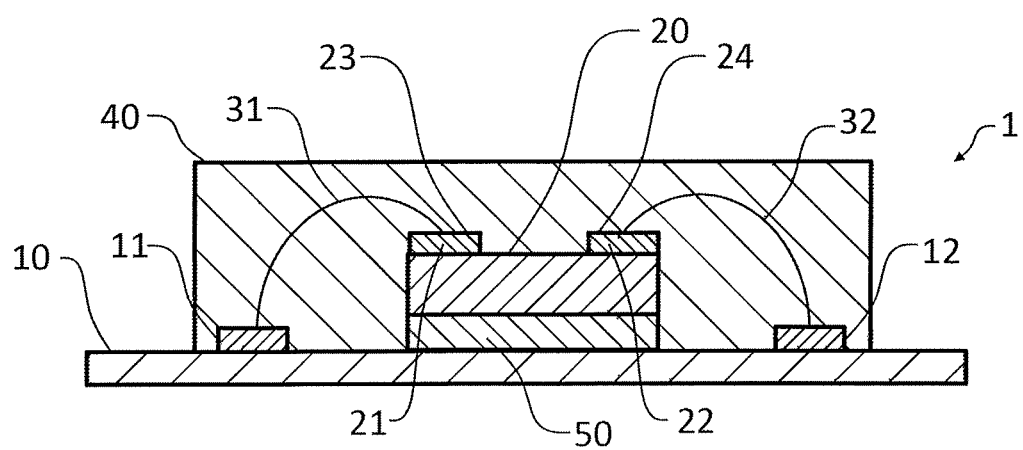
FIG. 1B is a cross-sectional view along the IA-IB line of FIG. 1A.

FIG. 1A is a plan view of an LED light emitting device according to an embodiment, while FIG. 1B is a cross-sectional view along the IA-IB line of FIG. 1A.

An LED light emitting device 1 has a mounting substrate 10, an LED device 20, wire bonding materials 30, a sealing member 40, and a bonding member 50.

The mounting substrate 10 is a printed circuit board comprising, as one example, a rectangular shape and having an LED device 20 mounted at the center of its surface. The mounting substrate 10 is, for example, comprised of alumina or another insulating material. The mounting substrate 10 comprises a first substrate electrode 11, second substrate electrode 12, first substrate interconnect 13, second substrate interconnect 14, first external electrode 15, and second external electrode 16. The first substrate electrode 11, second substrate electrode 12, first substrate interconnect 13, second substrate interconnect 14, first external electrode 15, and second external electrode 16 are respectively conductive materials. In one example, they are formed by copper plating.

The LED device 20 has an anode comprised of a first device electrode 21 and a cathode comprised of a second device electrode 22 on its surface. A connection surface 23 of the first device electrode 21 and a connection surface 24 of the second device electrode 22 are covered by gold. The back surface of the LED device 20 is bonded by the bonding member 50 to the front surface of the mounting substrate 10.

The wire bonding materials 30 include a first wire bonding material 31 and second wire bonding material 32 respectively made of gold wire. One end of the first wire bonding material 31 is connected to the first substrate electrode 11, while the other end of the first wire bonding material 31 is connected to the gold covered connection surface 23 of the first device electrode 21. One end of the second wire bonding material 32 is connected to the second substrate electrode 12, while the other end of the second wire bonding material 32 is connected to the gold covered connection surface 24 of the second device electrode 22.

The sealing member 40 is arranged so as to seal the first substrate electrode 11, second substrate electrode 12, LED device 20, and wire bonding materials 30. The sealing member 40 is an epoxy resin or silicone resin or other colorless and transparent resin.

The bonding member 50 is a silicone composition obtained by mixing a condensation reaction-type die bonding agent containing a plurality of components such as shown below and causing it to react and cure by a condensation reaction. The bonding member 50 bonds the front surface of the mounting substrate 10 and the back surface of the LED device 20.

As the condensation reaction-type die bonding agent used for forming the bonding member 50, various known ones can be used so long as condensation reaction-type die bonding agents with little liability of poor electrical connection occurring at the electrodes, but one where the bonding member cures down to the deep parts and cracks and voids are not caused is preferable. For this reason, it is necessary to reduce the amounts of the water or alcohol or other low molecular weight components produced along with the condensation reaction and the organic solvents and other volatile components. Further, if the mechanical strength of the bonding member is low and member is soft, when wire bonding the LED device bonded by the bonding member, the LED device will shake and the LED device and bonding material are liable to not be sufficiently joined and bonding defects are liable to occur. The bonding member has to be raised in mechanical strength and hardened in order to reduce the rate of occurrence of bonding defects. As a result of consideration of these circumstances, the die bonding agent according to the present embodiment is particularly preferably one using a non-solvent type composition containing a predetermined (A) silanol group-containing polyalkylsilsesquioxane solid in state at room temperature (below, also referred to as the "(A) component"), a predetermined (B) polyalkylsilsesquioxane liquid in state at room temperature (below, also referred to as the "(B) component"), and (C) a condensation reaction catalyst (below, also referred to as the "(C) component").

The (A) component is a polysilsesquioxane solid in state at room temperature having trisiloxy units ($T_A$) expressed by $R^1SiO_{3/2}$ (where, $R^1$ indicates one type of group selected from the group comprising C1 to C15 alkyl groups, a phenyl group, and a benzyl group, same below) and having hydroxyl groups.

As the C1 to C15 alkyl groups among $R^1$, for example, a methyl group, ethyl group, n-propyl group, isopropyl group, n-butyl group, isobutyl group, n-pentyl group, isopentyl group, n-hexyl group, isohexyl group, decyl group, isodecyl group, and cyclohexyl group and mixtures of the same etc. may be mentioned. The phenyl group, benzyl group, and cyclohexyl group may have one or more hydrogens on the rings substituted by the C1 to C15 alkyl groups. However, $R^1$ does not include an isocyanate group, thiol group, amino group, epoxy group, acid anhydride group, vinyl group, or other reactive functional group. Note that, the number of carbon atoms of the alkyl group is not limited to a whole number. For example, the number of carbon atoms may also be 1.3.

$T_A$ can be subdivided into T1 structures [$R^1O$—Si($R^1$)($OR^1$)—O—], T2 structures [—($R^1$)Si($OR^1$)(O—)—O—], and T3 structures [—($R^1$)Si(O—)$_2$—O—]. The ratio of these is not particularly limited, but usually is a molar ratio of T1:T2:T3=0 to 5:10 to 40:90 to 60 or so, preferably 0:20 to 30:80 to 70 or so. The structures can be identified by, for example, measuring the $^{29}$Si-NMR spectrum of the (A) component.

The ratio of $T_A$ in the (A) component is not particularly limited, but if considering the balance of the anticipated effects of the present embodiment, in particular the balance of the solubility, curability, etc. of the die bonding agent according to the present embodiment and the mechanical strength, bondability, crack resistance, void resistance, etc. of the bonding member, the ratio is usually 90 mol % or more, preferably 95 mol % or more, more preferably 100 mol %. Further, so long as the (A) component maintains its solid state at room temperature, other units ($M_A$ units, $D_A$ units, $Q_A$ units) can also be simultaneously present in some amounts. The ratio of these other units is not particularly limited, but usually is less than 10 mol %, preferably less than 5 mol %.

The structure of the (A) component can specifically be expressed by the following average unit formula:

$(R^1SiO_{3/2})_x[R^1_aSiO_{(4-a)/2}]_y$  [Chem. 1]

where, 0<a≤3, 0<x, 0≤y, and x+y=1. Preferably, x=1 and y=0.

The (A) component includes hydroxyl groups derived from silanol groups. The content of the hydroxyl groups is not particularly limited, but is usually 1 to 10 wt % or so with respect to the total amount of the (A) component. Due to the content of the hydroxyl groups being 1 wt % or more, the mechanical strength and bondability etc. of the bonding member tend to become excellent. Further, due to it being 10 wt % or less, the amount of desorbed components accompanying the curing reaction is decreased and the crack resistance and void resistance of the bonding member tend to become excellent. From such a viewpoint, the content of the hydroxyl groups is preferably 2 to 5 wt % or so.

The (A) component can be produced by various known methods. Below, a nonlimitative manufacturing example of the (A) component will be shown.

The starting material of the (A) component, that is, trialkoxysilane (a1) (below, also referred to as the "(a1) component") is expressed by the general formula $X^1Si(OX^1)_3$ (where, $X^1$ indicates a C1 to C15 alkyl group, phenyl group, benzyl group, hydroxyl group, or halogen atom and may be the same or different). As the halogen atom, fluorine, chlorine, etc. may be mentioned. As the C1 to C15 alkyl groups and the phenyl group, the ones mentioned above may be mentioned. None include reactive functional groups.

As specific examples of the (a1) component, for example, methyltrimethoxysilane, methyltriethoxysilane, ethyltrimethoxysilane, ethyltriethoxysilane, propyltrimethoxysilane, propyltriethoxysilane, hexyltrimethoxysilane, hexyltriethoxysilane, octyltriethoxysilane, decyltrimethoxysilane, phenyltrimethoxysilane, phenyltriethoxysilane, 3-hydroxypropyltriethoxysilane, trichloromethoxysilane, trichloroethoxysilane, trifluoropropyltrimethoxysilane, etc. may be mentioned. Among these as well, if using methyltrimethoxysilane, the reactivity of the (A) component and the (B) component becomes excellent and the balance of the anticipated effects of the present embodiment, in particular the balance of the heat resistance, transparency, and void resistance, becomes excellent.

For the purpose of introducing at least one of the units selected from the group comprised of $M_A$ units, $D_A$ units, and $Q_A$ units along with the (a1) component, the later explained (b2) component, (b3) component, and (b4) component can be used together in accordance with need.

The (A) component is obtained by causing a reaction of the (a1) component by hydrolysis and condensation.

The conditions of the hydrolysis reaction are not particularly limited, but are usually 25 to 90° C. or so and 30 minutes to 10 hours or so. The amount of the water used added to the reaction system is not particularly limited, but is usually a range of [number of moles of water/number of moles of $OR^1$ groups contained in the (a1) component] of 0.3 to 1 or so.

At the time of the hydrolysis reaction, various known catalysts can be used. Specifically, for example, formic acid, acetic acid, hydrochloric acid, sulfuric acid, nitric acid, p-toluenesulfonic acid, phosphoric acid and cation exchange resins and other acidic catalysts or sodium hydroxide, potassium hydroxide, calcium hydroxide, 1,8-diazabicyclo[5.4.0]undec-7-ene, 1,5-diazabicyclo[4.3.0]non-5-ene, tetramethylammonium hydroxide, tetrabutylammonium hydroxide, pyridine, and other basic catalysts may be mentioned. The amount of use of the catalyst is not particularly limited, but usually is 0.001 to 1 part by mass or so with respect to 100 parts by mass of the (a1) component.

At the time of the hydrolysis reaction, various known solvents may be used. Specifically, for example, benzene, toluene, xylene, hexane, heptane, methanol, ethanol, n-propanol, iso-propanol, ethyleneglycol dimethyl ether, diethyleneglycol dimethyl ether, triethyleneglycol dimethyl ether, diethyleneglycol methylethyl ether, diethyleneglycol diethyl ether, tetrahydrofuran, 1,4-dioxane, methyl acetate, ethyl acetate, butyl acetate, N,N-dimethylformamide, N,N-dimethylacetoamide, N-methyl-2-pyrrolidone, acetone, 2-butanone, methyl-iso-butylketone, acetonitrile, dimethylsulfoxide, etc. may be mentioned.

The hydrolyzed product is further subjected to a condensation reaction to form siloxane bonds between the hydroxyl groups or between the hydroxyl groups and residual —OR$^1$ groups and give the targeted (A) component. The condensation reaction conditions are not particularly limited but are usually 40 to 150° C. or so and usually 1 to 12 hours or so. The condensation reaction can be performed in the above solvents. Note that, the die bonding agent according to the present embodiment is preferably a nonsolvent type, so the solvent is preferably removed from the (A) component by various known means after the hydrolysis and condensation reactions.

The physical properties of the (A) component are not particularly limited, but if considering the balance of the anticipated effects of the present embodiment, the softening point (value measured based on JIS K5903, same below when referring to the softening point) is usually 40 to 150° C. or so. The lower limit value is preferably 50° C. or so, more preferably 60° C. or so. The upper limit value is preferably 130° C. or so, more preferably 120° C. or so. If the softening point of the (A) component is in such a range, the mechanical properties of the bonding agent according to the present embodiment tend to become good. The weight average molecular weight is also not particularly limited, but is usually 2,000 to 10,000 or so. The lower limit value is preferably 3,000 or so, while the upper limit value is preferably 7,000 or so. By the weight average molecular weight of the (A) component being at least the lower limit value, volatilization and bleedout of the low molecular weight components when heating the bonding agent according to the present embodiment to cure it tend to be suppressed. Further, by it being not more than the upper limit value, the solubility of the die bonding agent according to the present embodiment tends to become better and, further, stringing is suppressed and the work efficiency otherwise also tends to become better.

The shape of the (A) component is not particularly limited but may be flakes, powder, a semisolid, etc. As commercially available products of the (A) component, for example, KR-220L and KR-220LP made by Shin-Etsu Chemical, YR3370 made by Momentive Performance Materials Japan, etc. may be mentioned.

The (B) component is a polysilsesquioxane liquid in state at room temperature having trisiloxy units ($T_B$) expressed by $R^2SiO_{3/2}$ (where, $R^2$ indicates one group selected from the group comprising C1 to C15 alkyl groups, a phenyl group, and a benzyl group) and having —OR$^2$ (where, R$^2$ indicates one group selected from the group comprising C1 to C15 alkyl groups, a phenyl group, and a benzyl group).

The C1 to C15 alkyl groups, phenyl groups, and benzyl groups forming the R$^2$'s are similar to those forming the R$^1$'s. None include the above reactive functional groups.

$T_B$, in the same way as $T_A$, can be subdivided into T1 structures [R$^2$O—Si(R$^2$)(OR$^2$)—O—], T2 structures [—(R$^2$) Si(OR$^2$)(O—)—O—], and T3 structures [—(R$^2$)Si(O—)$_2$—O—]. The ratio of these also is not particularly limited. The structures can be identified by, for example, measuring the $^{29}$Si-NMR spectrum of the (B) component.

The ratio of $T_B$ in the (B) component is not particularly limited, but if considering the balance of the anticipated effects of the present embodiment, in particular the balance of the solubility, handling ability, curability, etc. of the die bonding agent according to the present embodiment and the mechanical strength, bondability, crack resistance, void resistance, etc. of the bonding member, the ratio is usually 95 mol % to 65 mol % or so, preferably 100 mol %.

So long as the (B) component maintains its liquid state at room temperature, other units ($M_B$ units, $D_B$ units, $Q_B$ units) can also be simultaneously present. The ratio of these other units is usually 5 to 35 mol % or so, preferably 0 mol %.

The structure of the (B) component can specifically be expressed by the following average unit formula:

$$(R^2SiO_{3/2})_{x'}[R^2{}_bSiO_{(4-b)/2}]_{y'}$$ [Chem. 2]

where, 0<b≤3, 0<x', 0≤y', and x'+y'=1. Preferably, x'=1 and y'=0.

Note that, the content of the hydroxyl groups in the (B) component is substantially 0 wt %. The content of —OR$^2$ can, for example, be found based on the $^1$H-NMR spectrum and is usually 15 to 45 wt % or so.

The (B) component can be produced by various known methods. Below, a nonlimitative manufacturing example of the (B) component will be shown.

One of the starting materials of the (B) component, that is, trialkoxysilane (b1) (below, also referred to as the "(b1) component"), is expressed by the general formula X$^2$Si(OX$^2$)$_3$ (where, X$^2$ indicates a C1 to C15 alkyl group, phenyl group, benzyl group, hydroxyl group, or halogen atom and may be the same or different). As the halogen atom, the C1 to C15 alkyl groups, and the phenyl group, the ones mentioned above may be mentioned. As the (b1) component, one mentioned as the (a1) component may be illustrated. Among these, methyltrimethoxysilane is preferable.

As the starting material of the (B) component, in addition, so long as the (B) component maintains its liquid state at room temperature, dialkoxysilane giving the $D_B$ units (below, also referred to as the "(b2) component"), monoalkoxysilane giving the $M_B$ units (below, also referred to as the "(b3) component"), and tetraalkoxysilane giving the $Q_B$ units (below, also referred to as the "(b4) component") can be simultaneously used.

The (b2) component is expressed by the general formula (X$^2$)$_2$Si(OX$^2$)$_2$ (where, X$^2$ is the same as the above and may be the same or different). As specific examples, for example, dimethyldimethoxysilane, phenylmethyldimethoxysilane, dimethyl diethoxysilane, phenylmethylmethoxyethoxysilane, etc. may be mentioned. The amount of use of the (b2) component with respect to the (b1) component is not particularly limited, but is usually, as a molar ratio, a range of (b1):(b2)=65 to 95:5 to 35 or so.

The (b3) component is expressed by the general formula (X$^2$)$_3$SiOX$^2$ (where, X$^2$ is the same as the above and may be the same or different). As specific examples, for example, trimethylmethoxysilane, trimethylethoxysilane, triethylmethoxysilane, triethylethoxysilane, tri(n-propyl)methoxysilane, tri(isopropyl)methoxysilane, tri(n-propyl)ethoxysilane, tri(n-butyl)methoxysilane, tri(isobutyl)methoxysilane, tri(isobutyl)ethoxysilane, dimethyltert-butylmethoxysilane, dimethylisobutylmethoxysilane, dimethylcyclopentylmethoxysilane, dimethylcyclohexylethoxysilane, etc. may be mentioned. The amount of use of the (b3) component with respect to the (b1) component is not particularly limited, but is usually, as a molar ratio, a range of (b1):(b3)=65 to 95:5 to 35 or so.

The (b4) component is expressed by the general formula Si(OX$^2$)$_4$ (where, X$^2$ is the same as the above and may be the same or different). As specific examples, for example, tetraethoxysilane, tetraisopropoxysilane, tetra-n-propoxysilane, tetrabutoxysilane, tetramethoxysilane, dimethoxydiethoxysilane, and other tetraalkoxysilanes etc. may be mentioned. The amount of use of the (b4) component with respect to the (b1) component is not particularly limited, but is usually, as a molar ratio, a range of (b1):(b4)=65 to 95:5 to 35 or so.

The (B) component is obtained by causing a hydrolysis reaction and condensation reaction of the (b 1) component and as necessary at least one type of component selected from the group comprised of the (b2) component, (b3) component, and (b4) component.

The conditions of the hydrolysis reaction are not particularly limited. Normally, they are 25 to 90° C. or so and 30 minutes to 10 hours or so. The amount of use of water added to the reaction system is also not particularly limited, but is a range where the number of moles of water/[total number of moles of —OR$^2$ included in the (b 1) component to (b4) component] becomes 0.1 to 1 or so.

At the time of the hydrolysis reaction, the above catalysts and solvents can be used.

The hydrolyzed product is further condensed to form siloxane bonds between the hydroxyl groups and residual —OR$^1$ groups in the product and give the targeted (B) component. The condensation reaction conditions are not particularly limited but are usually 40 to 150° C. or so and 1 to 12 hours or so. The condensation reaction can be performed in the above solvents. Note that, the die bonding agent according to the present embodiment is preferably a nonsolvent type, so the solvent is preferably removed from the (B) component by various known means after the hydrolysis and condensation reactions.

The physical properties of the (B) component are not particularly limited, but in optimizing the anticipated effects of the present embodiment, the viscosity is normally 5 to 10,000 mPa·s/25° C. or so. The upper limit value is preferably 5,000 mPa·s/25° C. or so, more preferably 2,000 mPa·s/25° C. or so. Note that, the die bonding agent according to the present embodiment is a heat curing type, but a room temperature curing type silicone composition can also be measured for viscosity at 23° C. In that case, in one embodiment, the viscosity is preferably 501 to 10,000 mPa·s/23° C. or more. By the viscosity of the (B) component being at least the preferable lower limit value, deviation of position when using the bonding agent according to the present embodiment to bond the LED device to the substrate tends to become rare. Further, by being not more than the upper limit value, the efficiency of coating work of the bonding agent according to the present embodiment tends to become excellent. Further, the weight average molecular weight of the (B) component is also not particularly limited, but from a similar viewpoint, is usually 500 to 9,000 or so. The lower limit value is preferably 700 or so, while the upper limit value is preferably 8,000 or so. By the weight average molecular weight of the (B) component being at least the lower limit value, volatilization or bleedout of the low molecular weight components when heating the bonding agent of the present embodiment to cure it tend to be suppressed. Further, by the weight average molecular weight of the (B) component being not more than the upper limit value, the solubility of the bonding agent according to the present embodiment becomes better and further stringing is suppressed and otherwise the work efficiency tends to become further better.

As commercially available products of the (B) component, for example, MSE100 made by Asahi Kasei Wacker Silicone, KC-89S and KR-500 made by Shin-Etsu Chemical, MTMS-A made by Tama Chemicals, etc. may be mentioned.

The ratio of use of the (A) component and the (B) component is not particularly limited, but usually the ratio ($M_{OR}/M_{OH}$) of the number of moles of the hydroxyl groups contained in the (A) component ($M_{OH}$) and the total number of moles of the —OR$^1$ contained in the (A) component and the —OR$^2$ contained in the (B) component ($M_{OR}$) is 0.1 to 20 or so. The lower limit value is preferably 0.5 or so, while the upper limit value is preferably 20 or so. The lower limit value is more preferably 0.8 or so, while the upper limit value is more preferably 15 or so in range. If the ratio is at least the lower limit value, defoaming when curing the bonding agent according to the present embodiment becomes excellent and, further, stringing when coating the same becomes hard to occur and otherwise the work efficiency tends to be optimized. Further, if the ratio is not more than the upper limit value, the bondability of the die bonding agent according to the present embodiment becomes optimized and, further, voids accompanying shrinkage upon curing become rare and, further, curability of the deep parts also tends to become excellent.

The solid content mass ratio of the (A) component and the (B) component is also not particularly limited, but usually the (B) component is 30 to 200 parts by mass or so with respect to 100 parts by mass of the (A) component. The lower limit value is preferably 40 parts by mass or so, while the upper limit value is preferably 150 parts by mass or so. By the amount of use of the (B) component being at least the lower limit value, the mechanical properties of the bonding member according to the present embodiment tend to become excellent. Further, by being not more than the upper limit value, the solubility and efficiency of coating work of the die bonding agent according to the present embodiment tend to be optimized.

As the (C) component, various known condensation reaction catalysts can be used. Specifically, for example, at least one compound of magnesium, aluminum, tin, zinc, iron, cobalt, nickel, zirconium, cerium, titanium, or other metal may be used. As such a compound, one type selected from the group comprised of titanium compounds, tin compounds, zinc compounds, and zirconium compounds is preferable. In particular, a tin compound and/or zirconium compound is preferable. Further, as the (C) component, one not containing a free carboxylic acid is preferable. If including a free carboxylic acid, the silver etc. of the surrounding members are liable to be corroded and discolored. As free carboxylic acids, 2-ethylhexanoic acid, trimethylhexanoic acid, octylic acid, neodecanoic acid, lauric acid, stearic acid, naphthenic acid, etc. may be mentioned.

As the titanium compound, for example, titanium diisopropoxybis(ethylacetoacetate), tetraethoxytitanium, tetrapropoxytitanium, tetrabutoxytitanium, diisopropoxy-bis (ethylacetoacetate)titanium, diisopropoxy-bis (methylacetoacetate)titanium, diisopropoxy-bis (acetylacetone)titanium, dibutoxy-bis(ethylacetoacetate) titanium, dimethoxy-bis(ethylacetoacetate)titanium, etc. may be mentioned.

As the tin compound, for example, dibutyltin methoxide, dibutyltin diacetate, dibutyltin dioctate, dibutyltin dilaurate, dioctyltin diacetate, dioctyltin maleate, dibutyltin oxyacetate, dibutyltin oxyoctylate, dibutyltin oxylaurate, dibutyltin bismethyl maleate, dibutyltin oxyoleate, or dibutyltin maleate polymer, dioctyltin maleate polymer, monobutyltin tris(2-ethylhexanoate), dibutyltin bis(acetylacetonate), etc. may be mentioned.

As the zinc compound, for example, zinc acetate, zinc acetylacetate, zinc 2-ethylhexanoate, zinc octylate, zinc neodecanoate, zinc laurate, zinc stearate, zinc naphthenate, zinc benzoate, zinc p-tert-butylbenzoate, zinc salicylate, zinc (meth) acrylate, zinc acetylacetonate, zinc 2,2,6,6-tetramethyl-3,5-heptanedionate, etc. may be mentioned.

As the zirconium compound, for example, tetrabutyl zirconate, zirconium trialkoxymononaphthate, zirconium trialkoxymonocyclopropane carboxylate, zirconium trialkoxycyclobutane carboxylate, zirconium trialkoxymonocycloopentane carboxylate, zirconium trialkoxymonocyclohexane carboxylate, zirconium trialkoxymonoadamantane carboxylate, zirconium tetraacetyl acetonate, etc. may be mentioned.

The amount of use of the (C) component is not particularly limited, but is usually 0.001 to 10 parts by mass or so with respect to a total 100 parts by mass of the (A) component and (B) component. The lower limit value is preferably 0.01 part by mass or so, more preferably 0.02 part by mass or so, while the upper limit value is preferably 5 parts by mass or so, more preferably 1 part by mass or so. By the amount of use of the (C) component being at least the lower limit value, the curability of the die bonding agent according to the present embodiment becomes excellent. Further, by being not more than the upper limit value, the storage stability of the die bonding agent and the yellowing resistance of the bonding member tend to become optimized. Note that, in the die bonding agent according to the embodiment, the anticipated effects can be achieved even if the amount of use of the (C) component is less than 0.1 part by mass, that is, is 0.001 to 0.099 part by mass.

The die bonding agent of the present embodiment may, for example, contain various known (D) inorganic fillers ((D) component) for the purpose of improving the crack resistance of the bonding member. Specifically, for example, silica (colloidal silica, fumed silica, etc.), barium titanate, titanium oxide, zirconium oxide, niobium oxide, aluminum oxide, cerium oxide, yttrium oxide, etc. may be mentioned. Among these, silica, particularly fumed silica, is preferable. The average primary particle size of the (D) component is not particularly limited, but is usually 100 μm or less. The lower limit value is preferably 5 nm or so, while the upper limit value is preferably 100 nm or so, more preferably 30 nm or so. By the average primary particle size of the (D) component being at least the lower limit value, the dispersion stability and efficiency of coating work of the bonding agent according to the present embodiment tend to become excellent. Further, by being not more than the upper limit value, the thixotropy (prevention of dripping after coating) of the die bonding agent according to the present embodiment and the crack resistance and transparency of the bonding member tend to be optimized.

The amount of the (D) component used is not particularly limited, but is usually 0.1 to 20 parts by mass or so with respect to the total 100 parts by mass of the (A) component and (B) component. The lower limit value is preferably 0.5 part by mass, while the upper limit value is preferably 10 parts by mass. By the amount of use of the (D) component being at least the lower limit value, the thixotropy of the die bonding agent according to the present embodiment and the crack resistance and transparency of the bonding member tend to be optimized. Further, by being not more than the upper limit value, the efficiency of coating work of the die bonding agent according to the present embodiment tends to become excellent and, further, the transparency of the bonding member tends to be optimized.

The die bonding agent of the present embodiment may, as needed, have further mixed into it a plasticizer, weathering agent, antioxidant, thermal stabilizer, lubricant, antistatic agent, whitening agent, colorant, conductive polymer, conductive filler, release agent, surface treatment agent, viscosity regulator, silane coupling agent, or other additive. Further, the die bonding agent of the present embodiment is preferably a nonsolvent type, so in one embodiment, the die bonding agent of the present embodiment does not contain a solvent.

The method for manufacturing the die bonding agent of the present embodiment is not particularly limited, but usually the solid (A) component and (C) component are added to the liquid (B) component, if necessary the (D) component and additives are further mixed in, then these are mixed until homogeneous.

The physical properties of the thus obtained die bonding agent are not particularly limited, but the viscosity is usually 5 to 1,000,000 mPa·s/25° C. or so. The lower limit value is preferably 500 mPa·s/25° C. or so, more preferably 1,000 mPa·s/25° C. or so. The upper limit value is preferably 500,000 mPa·s/25° C. or so, more preferably 200,000 mPa·s/25° C. or so. By the viscosity being at least the lower limit value, the bonding layer comprised of the bonding agent of the present embodiment tends to become easy to make the desired thickness and, further, deviation of position of the LED light emitting device can easily be prevented. By it being not more than the upper limit value, the bonding agent of the present embodiment tends to become easier to coat in a thin film and, further, the efficiency of the coating work tends to be optimized.

The die bonding agent of the present embodiment usually can be made to cure under conditions of 25 to 200° C. or so and 30 minutes to 5 hours or so.

Figure 2A:
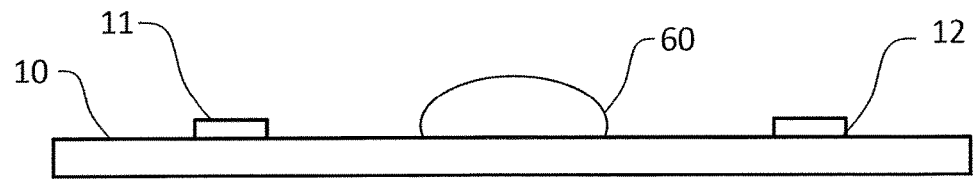
FIG. 2A is a view showing a first step of a manufacturing process of the LED light emitting device shown in FIGS. 1A and 1B.
Figure 2B:
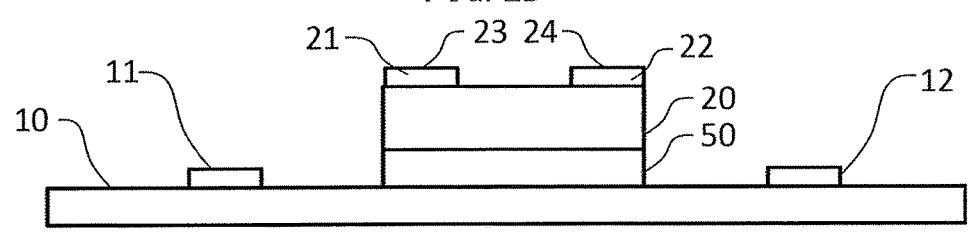
FIG. 2B is a view showing a second step following the first step of a manufacturing process of the LED light emitting device shown in FIGS. 1A and 1B.
Figure 2C:
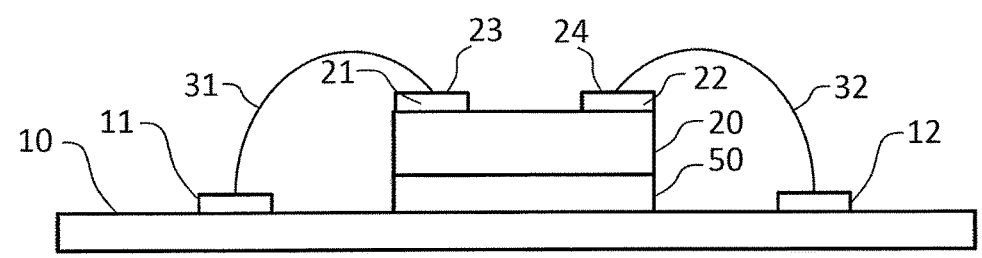
FIG. 2C is a view showing a third step following the second step of a manufacturing process of the LED light emitting device shown in FIGS. 1A and 1B.
Figure 2D:
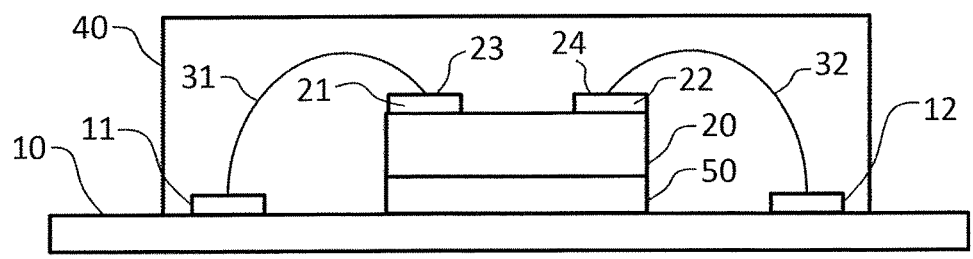
FIG. 2D is a view showing a fourth step following the third step of a manufacturing process of the LED light emitting device shown in FIGS. 1A and 1B.

FIGS. 2A to 2D are views showing steps for manufacturing the LED light emitting device 1. FIG. 2A is a view showing a first step, FIG. 2B is a view showing a second step following the first step, FIG. 2C is a view showing a third step following the second step, and FIG. 2D is a view showing a fourth step following the third step.

At the time of manufacturing the LED light emitting device 1, first, as shown in FIG. 2A, the condensation reaction-type die bonding agent 60 is placed on the front surface of the mounting substrate 10. The method of placement (coating) is not particularly limited. For example, a dispenser or screen printing etc. can be used.

Next, as shown in FIG. 2B, the back surface of the LED device 20 is bonded to the front surface of the mounting substrate 10 through the die bonding agent 60. The die bonding agent 60 is heat treated or other treated to cause a condensation reaction, then is cured to form the bonding member 50 which bonds the front surface of the mounting substrate 10 and the back surface of the LED device 20.

Next, as shown in FIG. 2C, the first substrate electrode 11 is wire bonded to the connection surface 23 of the first device electrode 21 by the first wire bonding material 31. Further, the second substrate electrode 12 is wire bonded to the connection surface 24 of the second device electrode 22 by the second wire bonding material 32.

Further, as shown in FIG. 2D, the sealing member 40 is placed so as to seal the first substrate electrode 11, second substrate electrode 12, LED device 20, first wire bonding material 31, and second wire bonding material 32.

In the LED light emitting device 1, the condensation reaction-type die bonding agent 60 bonding the mounting substrate 10 and the LED device 20 is free from vaporization of siloxane having SiH groups, so no insulation layers are formed on the gold covered connection surfaces of the device electrodes of the LED device 20. In the LED light emitting device 1, since no insulation layers are formed on the connection surfaces of the device electrodes of the LED device 20, at the time of wire bonding, there is little liability of poor electrical connection being caused between the substrate electrodes of the mounting substrate 10 and the device electrodes of the LED device.

EXAMPLES

Below, examples and comparative examples of the die bonding agent able to be utilized as the condensation reaction-type die bonding agent 60 shown in FIG. 2A will be explained in detail, but these do not limit the scope of the present invention. Further, in the following examples and comparative examples, "parts" are based on mass unless otherwise particularly indicated.

In the manufacturing examples, the weight average molecular weight is a value converted to polystyrene standard mass by the gel permeation chromatography method (apparatus used: HLC-8220 made by Toso, column: TSKgel α-M made by Toso, development solvent: tetrahydrofuran).

In the manufacturing examples, the shift value of 1H-NMR is a measurement value obtained using a 400-MR (400 MHz, CDCl3) made by VARIAN.

In the examples, the viscosity is a measurement value obtained using an E-type viscometer (product name "RE-80U", made by Toki Sangyo, rotor no. 1°34×R24, rotor speed 5 rpm).

Manufacture of (B) Component

Manufacturing Example 1

A reaction apparatus provided with a stirrer, cooling tube, thermometer, and nitrogen introduction tube was charged with methyltrimethoxysilane 136.2 parts and water 10.8 parts, then the reaction system was raised in temperature to 40° C. Next, formic acid 0.14 part was charged and the hydrolysis reaction started. After the start of the reaction, due to the reaction heat, the temperature of the reaction system reached 62° C., but after that the temperature fell to 40° C., so the system was held at that temperature for 30 minutes. After that, the byproduct methanol was removed to the outside of the system while the reaction system was raised in temperature to 120° C. over 3 hours. Next, the system was subjected to a condensation reaction at the same temperature for 1 hour to thereby obtain a liquid state polysilsesquioxane (B-1) having trisiloxy units shown by $CH_3SiO_{3/2}$ (x=1, y=0). The viscosity of the (B-1) component was 20 mPa·s/25° C., while the weight average molecular weight was 900. Further, the content of the residual methoxy groups measured by the peak strength of 1H-NMR (δ3.2-3.8) (below, also abbreviated as "content of residual methoxy groups") was about 32 wt %.

Manufacturing Example 2

Except for making the amount of water charged 16.2 parts in Manufacturing Example 1, the same procedure was followed to obtain a liquid state polysilsesquioxane (B-2) having trisiloxy units expressed by $CH_3SiO_{3/2}$ (x=1, y=0). The viscosity of the (B-2) component was 350 mPa·s/25° C., the weight average molecular weight was 2500, and the content of residual methoxy groups was about 24 wt %. No peak of residual hydroxyl groups could be found.

Manufacturing Example 3

Except for making the methyltrimethoxysilane 136.2 parts, the dimethyldimethoxysilane 51.5 parts, and the water 27.8 parts in Manufacturing Example 1, the same procedure was followed to obtain polysilsesquioxane (B-3) having $(CH_3)_{1.3}SiO_{1.35}$ as average siloxy units (x'=0.7, y'=0.3, b=2). The viscosity of the (B-3) component was 1,600 mPa·s/25° C., the weight average molecular weight was 7000, and the content of residual methoxy groups was about 19 wt %. No peak of residual hydroxyl groups could be found.

Manufacture of Condensation Reaction-Type Die Bonding Agent

Example 1

An (A) component comprised of polysilsesquioxane solid at room temperature (product name "KR220L", made by Shin-Etsu Chemical, flakes, $R^1$=methyl group, silanol group-derived hydroxyl group content 3 wt %, $T_A$ units 100 mol %, softening point 67° C.): 50 parts, a (B) component comprised of the (B-1) component: 50 parts, a (C) component comprised of zirconium chelate (made by Matsumoto Fine Chemical, ZC-700 (zirconium tetraacetylacetonate 20% solution)): 0.3 part, and a (D) component comprised of commercially available fumed silica (product name "AEROSIL RX200", made by Aerosil Japan, average primary particle size 12 nm): 5.5 parts were mixed well at room temperature to obtain a homogeneous transparent die bonding agent 1 (6,000 mPa·s/25° C.).

Example 2

Except for using a (B) component comprised of the (B-2) component: 50 parts, the same procedure was followed as in Example 1 to obtain a homogenous transparent die bonding agent 2 (8,000 mPa·s/25° C.).

Example 3

Except for using a (B) component comprised of the (B-3) component: 50 parts, the same procedure was followed as in Example 1 to obtain a homogenous transparent die bonding agent 3 (35,000 mPa·s/25° C.).

Example 4

Except for using a (C) component comprised of dioctyltin: 0.1 part, the same procedure was followed as in Example 1 to obtain a homogenous transparent die bonding agent 4 (6,000 mPa·s/25° C.).

Example 5

Except for using a (C) component comprised of titanium chelate (made by Matsumoto Fine Chemical, TC-710 titanium diisopropoxybis(ethylacetoacetate) 63% solution): 0.1 part, the same procedure was followed as in Example 1 to obtain a homogenous transparent die bonding agent 5 (6,000 mPa·s/25° C.).

Example 6

Except for not using the (D) component, the same procedure was followed as in Example 1 to obtain a homogenous transparent die bonding agent 6 (1,000 mPa·s/25° C.).

Example 7

An (A) component comprised of polysilsesquioxane solid in state at room temperature (product name "Z-6018", made by Dow Corning Corp., flakes, $R^1$=phenyl groups and propyl groups, silanol group-derived hydroxyl group content of 6 wt %, $T_A$ units 100 mol %, softening point 40° C.): 40 parts and a (B) component comprised of polysilsesquioxane liquid in state at room temperature (product name "MSE-100", made by Wacker Chemie AG, $R^1$=methyl group, viscosity 30 mPa·s/25° C., alkoxy group content 32 wt %): 60 parts were mixed well at 130° C. to obtain a homogeneous colorless transparent liquid. Next, to this, a (C) component comprised of ZC-700: 0.3 part was mixed well at room temperature to obtain a homogeneous transparent die bonding agent 7 (2,300 mPa·s/25° C.).

Example 8

An (A) component comprised of KR-220L: 50 parts and a (B) component comprised of polysilsesquioxane liquid in state at room temperature (product name "X-40-9227", made by Shin-Etsu Chemical, $R^1$=methyl group and phenyl group, viscosity 20 mPa·s/25° C., alkoxy group content 15 wt %): 50 parts were mixed well at 130° C. to obtain a homogeneous colorless transparent liquid. Next, to this, a (C) component comprised of ZC-700: 0.8 part and a (D) component comprised of AEROSIL RX200: 3.0 parts were mixed well at room temperature to obtain a homogeneous transparent die bonding agent 8 (8,000 mPa·s/25° C.).

Example 9

An (A) component comprised of Z-6018: 60 parts and a (B) component comprised of X-40-9227: 40 parts were mixed well at 130° C. to obtain a homogeneous colorless transparent liquid. Next, to this, a (C) component comprised of ZC-700: 3.0 parts was mixed well at room temperature to obtain a homogeneous transparent die bonding agent 9 (4,100 mPa·s/25° C.).

Comparative Example 1

An addition reaction die bonding agent A containing siloxane containing SiH groups and siloxane containing vinyl groups (made by Toray-Dow Corning, OE-8001 (Lot No. 0007308993)) was obtained.

Comparative Example 2

An addition reaction die bonding agent B containing siloxane containing SiH groups with a larger amount of separation than the siloxane containing SiH groups contained in the die bonding agent A of Comparative Example 1 and siloxane containing vinyl groups (made by Shin-Etsu Chemical, KER-3000-M2 (Lot No. 210178)) was obtained.

Comparative Example 3

Except for changing the (C) component to 0.3 part of a 20% 3,5,5-trimethylhexanoic acid solution of zirconium tetraacetylacetonate, the same procedure was followed as in Example 1 to obtain a homogeneous transparent die bonding agent C (6,000 mPa·s/25° C.).

Table 1 shows the amounts of the components in the above-mentioned examples and comparative examples.

TABLE 1-1

|  |  |  | Ex. 1 Comp. 1 | Ex. 2 Comp. 2 | Ex. 3 Comp. 3 | Ex. 4 Comp. 4 | Ex. 5 Comp. 5 | Ex. 6 Comp. 6 |
|---|---|---|---|---|---|---|---|---|
| (A) | Room temperature solid | KR220L | 50 | 50 | 50 | 50 | 50 | 50 |
|  |  | MK | 0 | 0 | 0 | 0 | 0 | 0 |
|  |  | Z-6018 | 0 | 0 | 0 | 0 | 0 | 0 |
| (B) | Room temperature liquid | (B-1) | 50 | 0 | 0 | 50 | 50 | 50 |
|  |  | (B-2) | 0 | 50 | 0 | 0 | 0 | 0 |
|  |  | (B-3) | 0 | 0 | 50 | 0 | 0 | 0 |
|  |  | MSE100 | 0 | 0 | 0 | 0 | 0 | 0 |
|  |  | X-40-9667 | 0 | 0 | 0 | 0 | 0 | 0 |
| (C) | Zirconium chelate/ZC-700 |  | 0.3 | 0.3 | 0.3 | 0 | 0 | 0.3 |
|  | Dioctyltin |  | 0 | 0 | 0 | 0.1 | 0 | 0 |
|  | Titanium chelate |  | 0 | 0 | 0 | 0 | 0.1 | 0 |
|  | Zirconium chelate/trimethyl hexanoic acid solution |  | 0 | 0 | 0 | 0 | 0 | 0 |
| (D) | Aerosil RX200 |  | 5.5 | 5.5 | 5.5 | 5.5 | 5.5 | 0 |
| Addition reaction type silicone containing SiH |  |  | 0 | 0 | 0 | 0 | 0 | 0 |

TABLE 1-2

|  |  |  | Ex. 7 Comp. 7 | Ex. 8 Comp. 8 | Ex. 9 Comp. 9 | Comp. Ex. 1 Comp. A | Comp. Ex. 2 Comp. B | Comp. Ex. 3 Comp. C |
|---|---|---|---|---|---|---|---|---|
| (A) | Room temperature solid | KR220L | 0 | 50 | 0 | 0 | 0 | 50 |
|  |  | MK | 0 | 0 | 0 | 0 | 0 | 0 |
|  |  | Z-6018 | 40 | 0 | 60 | 0 | 0 | 0 |
| (B) | Room temperature liquid | (B-1) | 0 | 0 | 0 | 0 | 0 | 50 |
|  |  | (B-2) | 0 | 0 | 0 | 0 | 0 | 0 |
|  |  | (B-3) | 0 | 0 | 0 | 0 | 0 | 0 |
|  |  | MSE100 | 60 | 0 | 0 | 0 | 0 | 0 |
|  |  | X-40-9667 | 0 | 50 | 40 | 0 | 0 | 0 |
| (Q | Zirconium chelate/ZC-700 |  | 0.5 | 1.5 | 6 | 0 | 0 | 0 |
|  | Dioctyltin |  | 0 | 0 | 0 | 0 | 0 | 0 |

TABLE 1-2-continued

|  | Ex. 7 Comp. 7 | Ex. 8 Comp. 8 | Ex. 9 Comp. 9 | Comp. Ex. 1 Comp. A | Comp. Ex. 2 Comp. B | Comp. Ex. 3 Comp. C |
|---|---|---|---|---|---|---|
| Titanium chelate | 0 | 0 | 0 | 0 | 0 | 0 |
| Zirconium chelate/trimethyl hexanoic acid solution | 0 | 0 | 0 | 0 | 0 | 0.3 |
| (D) Aerosil RX200 | 0 | 3.0 | 0 | 0 | 0 | 5.5 |
| Addition reaction type silicone containing SiH | 0 | 0 | 0 | 100 | 100 | 0 |

Confirmation of Siloxane Contamination

<Measurement Conditions>

The condensation reaction-type die bonding agent 1 of Example 1 and the die bonding agents A and B of Comparative Examples 1 and 2 were heated by a pyrolyzer. The thus generated gases were analyzed for compositions by a gas chromatography mass analyzer. For the pyrolyzer, PY2010id made by Frontier Lab was used, while for the gas chromatography mass analyzer, GC-MS QP2010 made by Shimadzu was used. Samples were heated at temperatures of 60° C., 100° C., 120° C., and 150° C. for 30 minutes in the pyrolyzer. By heating at the temperatures of 60° C., 100° C., 120° C., and 150° C., it is possible to obtain a grasp of the state of vaporization of siloxane having SiH groups at the respective temperatures. The chromatography conditions in the gas chromatography mass analyzer were use of a column UA-5, a temperature program of heating at 50° C. for 1 minute, then raising the temperature by 20° C. per minute until 300° C., and heating at 300° C. for 10 minutes. Further, the mass spectrum measurement conditions in the gas chromatography mass analyzer were scanning in a range of molecular weight (m/z) of 10 to 600.

Results of Measurement

Figure 3:
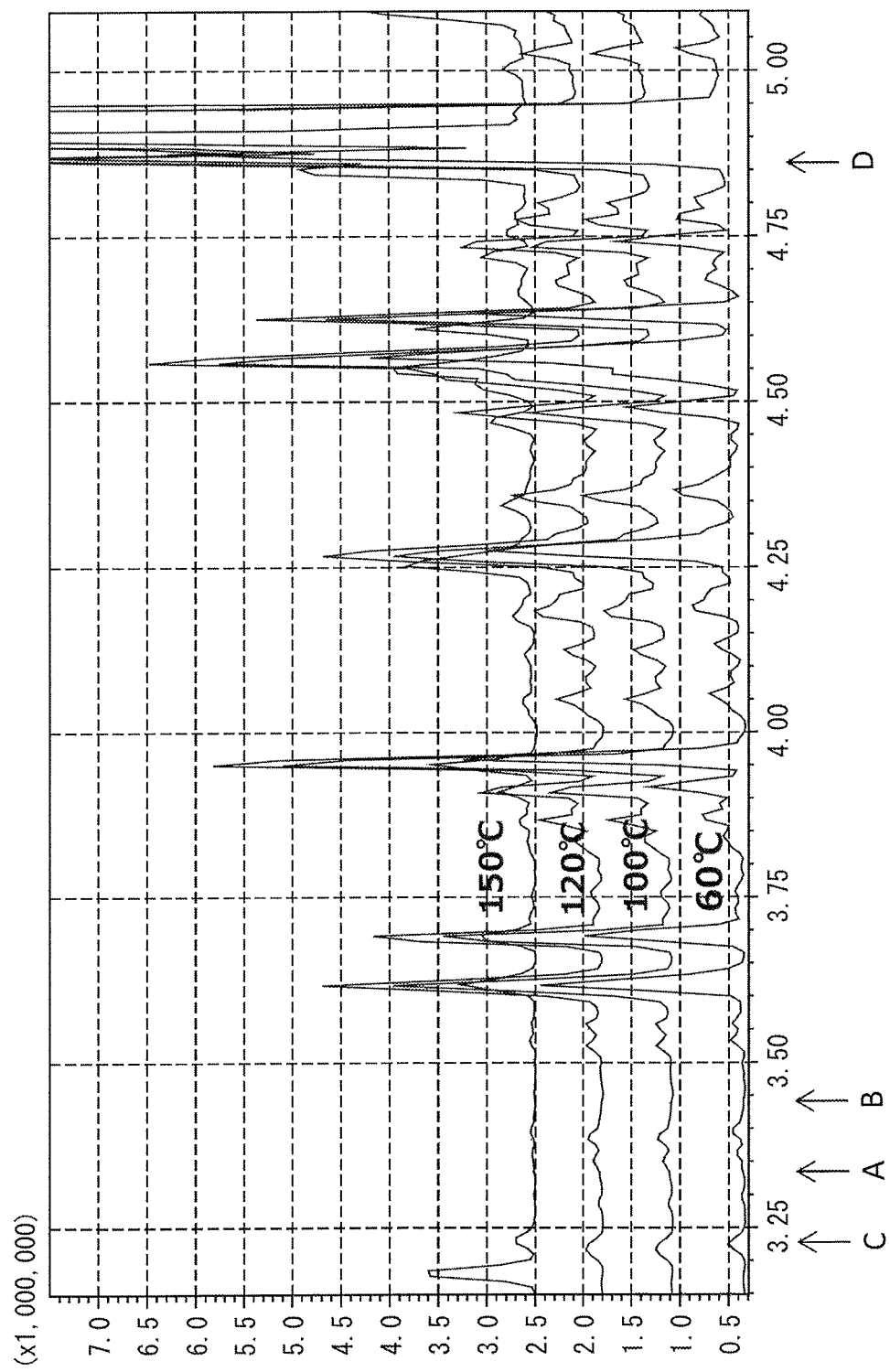
FIG. 3 is a view showing a chromatogram of a condensation reaction-type die bonding agent of Example 1.
Figure 4:
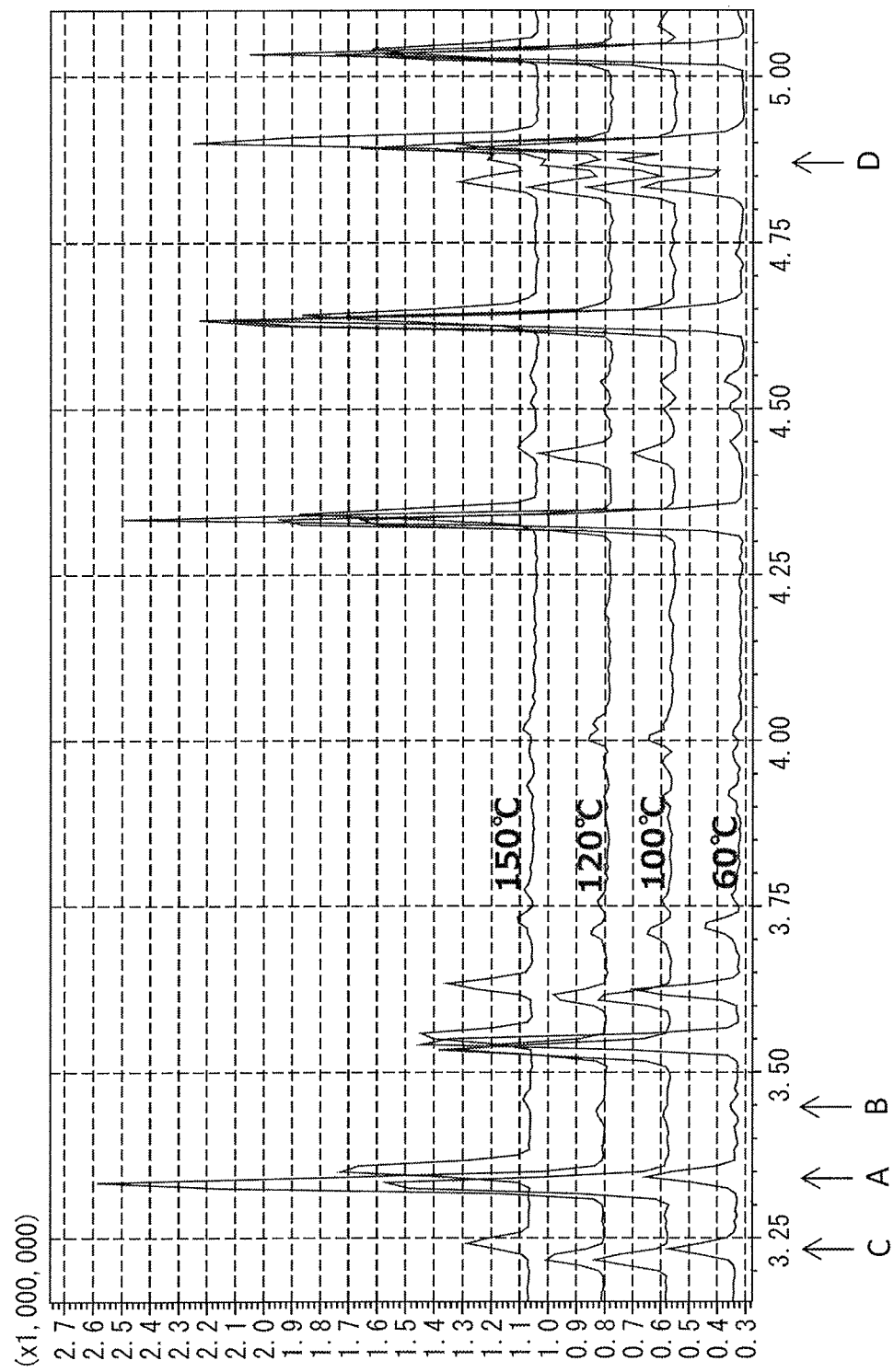
FIG. 4 is a view showing a chromatogram of an addition reaction-type die bonding agent of Comparative Example 1.
Figure 5:
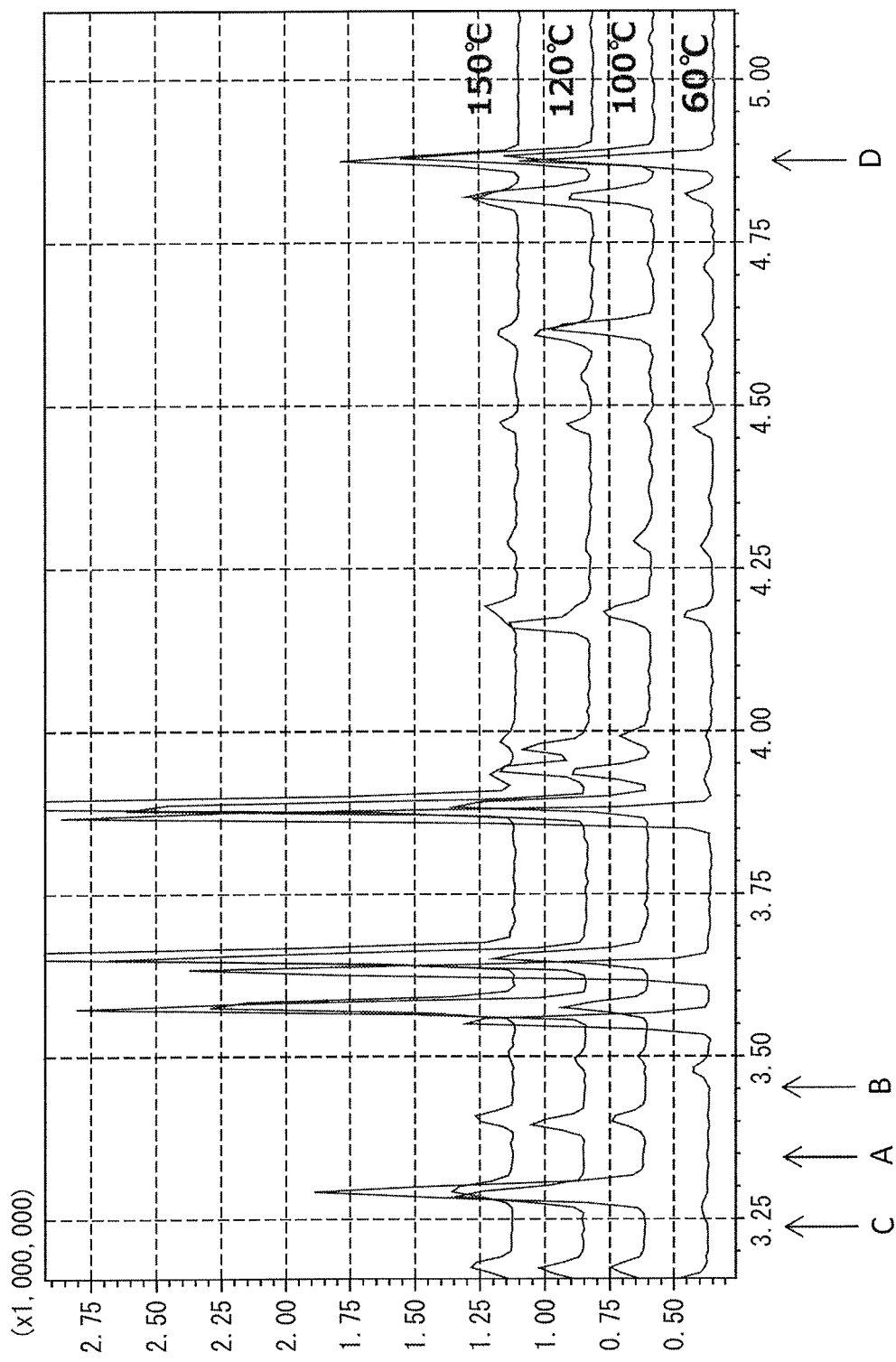
FIG. 5 is a view showing a chromatogram of an addition reaction-type die bonding agent of Comparative Example 2.

FIG. 3 is a view showing the chromatogram of the condensation reaction-type die bonding agent 1 of Example 1. FIG. 4 is a view showing the chromatogram of the addition reaction-type die bonding agent A of Comparative Example 1, while FIG. 5 is a view showing the chromatogram of the addition reaction-type die bonding agent B of Comparative Example 2. The abscissas of FIGS. 3 to 5 show the holding times, while the ordinates show the distributions of concentrations of the solutes. Further, in FIGS. 3 to 5, the arrow A shows the duration of detection of the compound containing SiH groups of tetramethylcyclotetrasiloxane. The arrow B shows the duration of detection of the compound containing SiH groups of heptamethyltrisiloxane. The arrow C shows the duration of detection of the compound not containing SiH groups of hexamethylcyclotrisiloxane, while the arrow D shows the duration of detection of the compound not containing SiH groups of octamethylcyclotetrasiloxane.

Further, Table 2 shows the results of judgment as to if siloxane having SiH groups is produced due to heating the die bonding agents of Examples 1 to 6 and Comparative Examples 1 to 2. Tables 3 to 5 show the detection peak areas per 1 mg samples in the chromatograms of Example 1 and the die bonding agents A and B of Comparative Example 1 and Comparative Example 2. Table 3 shows the sum of the detection peak areas of the compounds containing SiH groups of tetramethylcyclotetrasiloxane and heptamethyltrisiloxane. Table 4 shows the detection peak area of the compound not containing SiH groups of hexamethylcyclotrisiloxane, while Table 5 shows the detection peak area of the compound not containing SiH groups of octamethylcyclotetrasiloxane. As shown in Table 2, in Examples 1 to 9, no siloxane having SiH groups is produced, so insulation layers are not liable to be formed on the gold covered connection surfaces of the device electrodes of the LED devices. On the other hand, in Comparative Examples 1 and 2, siloxane having SiH groups is produced, so insulation layers are liable to be formed on the gold covered connection surfaces of the device electrodes of the LED devices and poor electrical connection is liable to occur.

TABLE 2

|  | Ex. 1 | Ex. 2 | Ex. 3 | Ex. 4 | Ex. 5 | Ex. 6 | Comp. Ex. 1 | Comp. Ex. 2 |
|---|---|---|---|---|---|---|---|---|
| Siloxane produced? | Not produced | Not produced | Not produced | Not produced | Not produced | Not produced | Produced | Produced |

TABLE 3

| Peak area per 1 mg sample | 60° C. | 100° C. | 120° C. | 150° C. |
|---|---|---|---|---|
| Ex. 1 | 0 | 0 | 0 | 0 |
| Comp. Ex. 1 | 541542 | 1900153 | 2908327 | 1302265 |
| Comp. Ex. 2 | 50430 | 2041169 | 2570895 | 1229026 |

TABLE 4

| Peak area per 1 mg sample | 60° C. | 100° C. | 120° C. | 150° C. |
|---|---|---|---|---|
| Ex. 1 | 309000 | 372953 | 356911 | 298032 |
| Comp. Ex. 1 | 336524 | 417105 | 323132 | 365713 |
| Comp. Ex. 2 | 452198 | 161165 | 355429 | 334452 |

TABLE 5

| Peak area per 1 mg sample | 60° C. | 100° C. | 120° C. | 150° C. |
|---|---|---|---|---|
| Ex. 1 | 514324 | 27640 | 13944 | 22502 |
| Comp. Ex. 1 | 625050 | 532559 | 378819 | 463194 |
| Comp. Ex. 2 | 335936 | 267092 | 613980 | 469069 |

In the die bonding agents 1, A, and B of Example 1 and Comparative Example 1 and Comparative Example 2, compounds not containing SiH groups of hexamethylcyclotrisiloxane and octamethylcyclotetrasiloxane are detected regardless of the temperature conditions. On the other hand, the compounds containing SiH groups of tetramethylcyclotetrasiloxane and heptamethyltrisiloxane are detected regardless of the temperature conditions in the die bonding agents A and B of Comparative Example 1 and Comparative Example 2, but are not detected at all in the die bonding agent 1 of Example 1. In the die bonding agents A and B of Comparative Example 1 and Comparative Example 2, the compounds containing SiH groups of tetramethylcyclotetrasiloxane and heptamethyltrisiloxane vaporize even at the relatively low temperature of 60° C. In the die bonding agents A and B of Comparative Example 1 and Comparative Example 2, the compounds containing SiH groups of tetramethylcyclotetrasiloxane and heptamethyltrisiloxane vaporize the most at 120° C. In the die bonding agents A and B of Comparative Example 1 and Comparative Example 2, the amounts of tetramethylcyclotetrasiloxane and heptamethyltrisiloxane detected decrease at 150° C. This is believed to be due to the increase in the amount of tetramethylcyclotetrasiloxane and heptamethyltrisiloxane contributing to the curing.

If heating the addition reaction type die bonding agents A and B of Comparative Examples 1 and 2 containing siloxane containing SiH groups and siloxane containing vinyl groups, the compounds containing SiH groups of the tetramethylcyclotetrasiloxane and heptamethyltrisiloxane vaporize. On the other hand, if heating the condensation reaction-type die bonding agents 1 to 6 of Examples 1 to 6, the compounds containing SiH groups of tetramethylcyclotetrasiloxane and heptamethyltrisiloxane do not vaporize. Even if the condensation reaction-type die bonding agents 1 to 6 of Examples 1 to 6 are heated, compounds containing SiH groups do not vaporize, so insulation layers are not liable to form on the gold covered connection surfaces of the device electrodes.

Figure 6A:
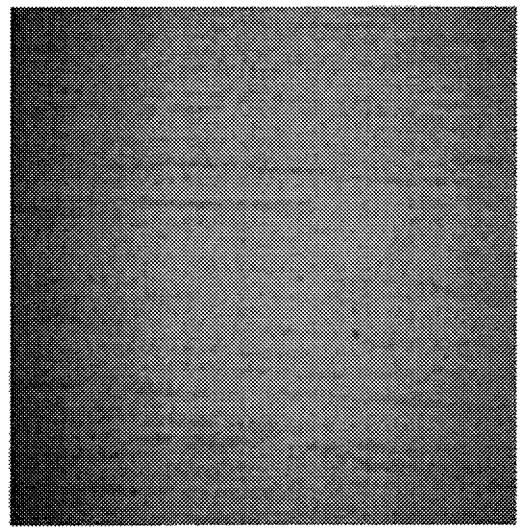
FIG. 6A is a view showing the state of a gold thin film exposed to an atmosphere containing substances vaporized upon heating of the condensation reaction-type die bonding agent of Example 1.
Figure 6B:
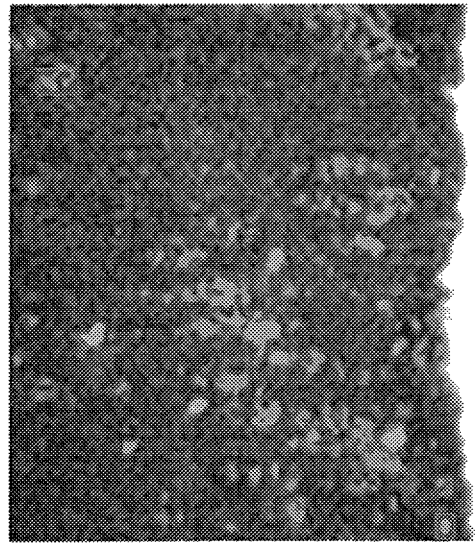
FIG. 6B is a view showing the state of a gold thin film exposed to an atmosphere containing substances vaporized upon heating of the addition reaction-type die bonding agent of Comparative Example 1.
Figure 6C:
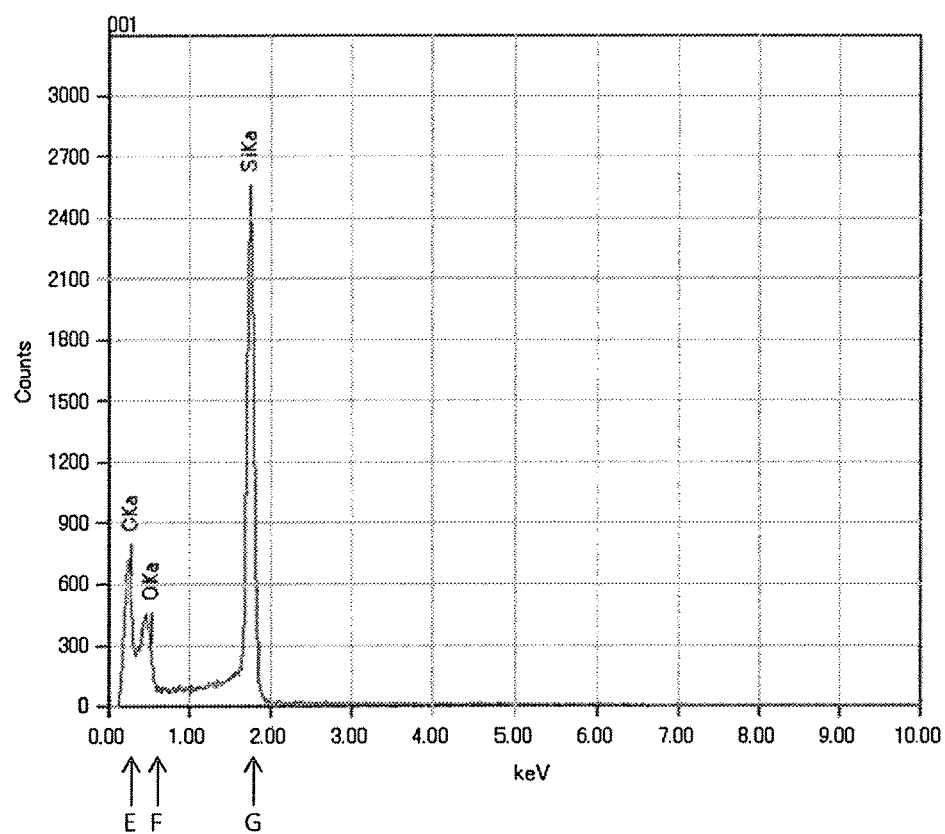
FIG. 6C is a view showing an ESD spectrum of the contaminants shown in FIG. 6B.

FIG. 6A is a view showing the state of a gold thin film exposed to an atmosphere containing substances vaporized by heating of the condensation reaction-type die bonding agent 1 of Example 1. FIG. 6B is a view showing the state of a gold thin film exposed to an atmosphere containing substances vaporized by heating of the addition reaction-type die bonding agent 1 of Comparative Example 1. FIG. 6C is a view showing the EDS spectrum of the contaminants shown in FIG. 6B. Each of the states of FIGS. 6A and 6B was obtained by coating 1 g of die bonding agent on a glass Petri dish and allowing it to stand together with a gold thin film at room temperature in a sealed space for 24 hours. After that, the die bonding agent was successively heated at temperatures of 100° C., 120° C., and 150° C. for 2 hours each. In FIG. 6C, the arrow E shows the spectrum of carbon, the arrow F shows the spectrum of oxygen, and the arrow G shows the spectrum of silicon.

The gold thin film exposed to the atmosphere containing substances vaporized by heating of the condensation reaction-type die bonding agent 1 of Example 1 was completely free of deposition of contaminants. The gold thin film exposed to the atmosphere containing substances vaporized by heating of the addition reaction-type die bonding agent A of Comparative Example 1 had deposition of contaminants. The impurities deposited on the gold thin film exposed to the atmosphere containing substances vaporized by heating of the addition reaction-type die bonding agent A of Comparative Example 1 were confirmed to include siloxane from the spectrum shown in FIG. 6C.

The condensation reaction-type die bonding agents 1 to 6 of Examples 1 to 6 were used as the die bonding agent 60 shown in FIG. 2A to manufacture LED light emitting devices 1 by the method shown in FIG. 2A to 2D. The connection surfaces of the device electrodes 21 of the LED devices 20 were free of contaminants deposited on them, so wire bonding was not obstructed. The condensation reaction-type die bonding agents 1 to 6 of Examples 1 to 6 were excellent in transferability and work efficiency and could form cured products excellent in hardness, heat discoloration resistance, bondability, and crack resistance by an addition reaction, so can be used as die bonding agents.

Confirmation of Contamination Causing Discoloration to Silver

Measurement Conditions

The present measurement was conducted for the purpose of confirming any contamination by the die bonding agents of Examples 1 to 9 and Comparative Examples 1 to 3 on silver members made much use of in an LED device. In a diameter 30 mm, height 65 mm glass container, a thickness 1 to 1.2 mm 10 mm square piece of glass covered by silver was set. Next, 2.5 ml of the die bonding agent of Example 1 was added to immerse the piece of glass. Aluminum foil and metal wire were used to seal the open surface of the top part of the glass container. The test piece was heated at 120° C. for 1 hour, then at 150° C. for 3 hours. It was allowed to cool at room temperature, then was visually checked for discoloration of the piece of glass covered by silver. The same procedure was followed to evaluate the die bonding agents of Examples 1 to 9 and Comparative Examples 1 to 3.

Results of Evaluation of Measurement Conditions

Table 6 shows the results of evaluation of contamination causing discoloration to silver in the die bonding agents at the above measurement conditions.

TABLE 6

| | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 | Comp. Ex. 3 |
|---|---|---|---|---|---|---|---|---|---|---|---|---|
| Presence of discoloration to silver | None | None | None | None | None | None | None | None | None | None | None | Yes |

From the results described in Table 6, even with a condensation reaction type die bonding agent composition, since no free carboxylic acids such as 3,5,5-trimethylhexanoic acid are included as the (C) component, no contamination causing discoloration to silver is caused and use for an optical electronic component such as an LED is possible.

What is claimed is:

1. A condensation reaction-type die bonding agent for bonding an LED device provided on its surface with device electrodes having connection surfaces covered by gold, said die bonding agent comprising:
   (A) a polysilsesquioxane solid in state at room temperature having trisiloxy units ($T_A$) expressed by $R^1SiO_{3/2}$ where, $R^1$ indicates one group selected from the group comprised of C1 to C15 alkyl groups, a phenyl group, and a benzyl group, and having hydroxyl groups;

(B) a polysilsesquioxane liquid in state at room temperature having 65 mol % to 100 mol % trisiloxy units ($T_B$) expressed by $R^2SiO_{3/2}$ where, $R^2$ indicates one group selected from the group comprised of C1 to C15 alkyl groups, a phenyl group, and a benzyl group, and having —$OR^2$ where, $R^2$ indicates one group selected from the group comprised of C1 to C15 alkyl groups, a phenyl group, and a benzyl group; and (C) a condensation reaction catalyst.

2. The condensation reaction-type die bonding agent according to claim 1, wherein a softening point of the (A) component is 40 to 150° C.

3. The condensation reaction-type die bonding agent according to claim 1, wherein a viscosity of the (B) component is 5 to 10,000 mPa·s/25° C.

4. The condensation reaction-type die bonding agent according to claim 1, further comprising (D) an inorganic filler.

5. A method for manufacturing an LED light emitting device comprising the steps of:
using a die bonding agent to bond an LED device provided on its surface with device electrodes having connection surfaces covered by gold to a surface of a mounting substrate having substrate electrodes;
connecting said substrate electrodes and said connection surfaces of said device electrodes by conductive interconnect members; and
sealing said LED device by a sealing member, wherein said die bonding agent is a condensation reaction type bonding agent comprising:
(A) a polysilsesquioxane solid in state at room temperature having trisiloxy units ($T_A$) expressed by $R^1SiO_{3/2}$ where, $R^1$ indicates one group selected from the group comprised of C1 to C15 alkyl groups, a phenyl group, and a benzyl group, and having hydroxyl groups,
(B) a polysilsesquioxane liquid in state at room temperature having 65 mol % to 100 mol % trisiloxy units ($T_B$) expressed by $R^2SiO_{3/2}$ where, $R^2$ indicates one group selected from the group comprised of C1 to C15 alkyl groups, a phenyl group, and a benzyl group, and having —$OR^2$ where, $R^2$ indicates one group selected from the group comprised of C1 to C15 alkyl groups, a phenyl group, and a benzyl group, and
(C) a condensation reaction catalyst.

6. The method for manufacturing an LED light emitting device according to claim 5 wherein the (C) condensation reaction catalyst is at least one catalyst selected from the group comprising compounds of magnesium, aluminum, tin, zinc, iron, cobalt, nickel, zirconium, cerium, titanium, and other metals.

7. The method for manufacturing an LED light emitting device according to claim 6 wherein the (C) condensation reaction catalyst does not comprise free carboxylic acid.

8. An LED light emitting device comprising:
a mounting substrate having substrate electrodes;
an LED device provided on its surface with device electrodes having connection surfaces covered with gold;
a bonding member for bonding a front surface of said mounting substrate and a back surface of said LED device;
conductive interconnect members with one ends connected to said substrate electrodes and with other ends connected to the connection surfaces of said device electrodes; and
a sealing member for sealing said LED device, wherein said bonding member is obtained by a condensation reaction of
(A) a polysilsesquioxane solid in state at room temperature having trisiloxy units ($T_A$) expressed by $R^1SiO_{3/2}$ where, $R^1$ indicates one group selected from the group comprised of C1 to C15 alkyl groups, a phenyl group, and a benzyl group, and having hydroxyl groups,
(B) a polysilsesquioxane liquid in state at room temperature having 65 mol % to 100 mol % trisiloxy units ($T_B$) expressed by $R^2SiO_{3/2}$ where, $R^2$ indicates one group selected from the group comprised of C1 to C15 alkyl groups, a phenyl group, and a benzyl group, and having $OR^2$ where, $R^2$ indicates one group selected from the group comprised of C1 to C15 alkyl groups, a phenyl group, and a benzyl group, and
(C) a condensation reaction catalyst.

9. The LED light emitting device according to claim 8, wherein the (C) condensation reaction catalyst is at least one catalyst selected from the group comprising compounds of magnesium, aluminum, tin, zinc, iron, cobalt, nickel, zirconium, cerium, titanium, and other metals.

10. The LED light emitting device according to claim 9, wherein the (C) condensation reaction catalyst does not comprise free carboxylic acid.

* * * * *

UNITED STATES PATENT AND TRADEMARK OFFICE
CERTIFICATE OF CORRECTION

PATENT NO. : 10,461,232 B2
APPLICATION NO. : 16/069556
DATED : October 29, 2019
INVENTOR(S) : Hiroo Kajiwara et al.

It is certified that error appears in the above-identified patent and that said Letters Patent is hereby corrected as shown below:

On the Title Page

ITEM [72], Inventors:
"Hideyuki Kobayashi, Osaka (JP)" should read --Hideyuki Kobayashi, Osaka-shi, Osaka (JP)--.
"Kenichiro Sato, Hadano (JP)" should read --Kenichiro Sato, Hadano-shi, Kanagawa (JP)--.
"Yuta Yaguchi, Hadano (JP)" should read --Yuta Yaguchi, Hadano-shi, Kanagawa (JP)--.

ITEM [73], Assignees:
"Citizen Watch Co., Ltd., Tokyo (JP)" should read --Citizen Watch Co., Ltd., Nishitokyo-shi, Tokyo (JP)--.
"Citizen Electronics Co., Ltd., Yamanashi (JP)" should read --Citizen Electronics Co., Ltd., Fujiyoshida-shi, Yamanashi (JP)--.

In the Claims

In Column 22, Line 35, in Claim 8:
"OR2" should read -- -OR2--.

Signed and Sealed this
Twenty-fifth Day of February, 2020

Andrei Iancu
*Director of the United States Patent and Trademark Office*